(12) United States Patent
Corneille

(10) Patent No.: US 11,271,126 B2
(45) Date of Patent: Mar. 8, 2022

(54) PHOTOVOLTAIC PANELS WITH FOLDED PANEL EDGES AND METHODS OF FORMING THE SAME

(71) Applicant: BEIJING APOLLO DING RONG SOLAR TECHNOLOGY CO., LTD., Beijing (CN)

(72) Inventor: Jason Corneille, Boulder Creek, CA (US)

(73) Assignee: BEIJING APOLLO DING RONG SOLAR TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 16/360,293

(22) Filed: Mar. 21, 2019

(65) Prior Publication Data

US 2020/0303575 A1   Sep. 24, 2020

(51) Int. Cl.
| H01L 31/05 | (2014.01) |
| H01L 31/18 | (2006.01) |
| H01L 31/049 | (2014.01) |
| H01L 31/0749 | (2012.01) |

(52) U.S. Cl.
CPC ............ *H01L 31/05* (2013.01); *H01L 31/049* (2014.12); *H01L 31/0749* (2013.01); *H01L 31/18* (2013.01)

(58) Field of Classification Search
None
See application file for complete search history.

(56) References Cited

U.S. PATENT DOCUMENTS

| 3,376,164 A | 4/1968 | Bachwansky |
| 3,553,030 A | 1/1971 | Lebrun |
| 3,713,893 A | 1/1973 | Shirland |
| 4,574,160 A | 3/1986 | Cull et al. |
| 5,034,068 A | 7/1991 | Glenn et al. |
| 5,391,235 A | 2/1995 | Inoue |
| 5,474,621 A | 12/1995 | Barnard |
| 5,626,688 A | 5/1997 | Probst et al. |
| 5,814,195 A | 9/1998 | Lehan et al. |

(Continued)

FOREIGN PATENT DOCUMENTS

DE   27 57 301 A1   7/1979

OTHER PUBLICATIONS

Richards, et al., "Enhancing the efficiency of production Cds/CdTe PV modules by overcoming poor spectral response at short wavelengths via luminescence down-shifting," 2006 IEEE 4th World Conference on Photovoltaic Energy Conversion, May 7-12, 2006, 4 pages.

(Continued)

*Primary Examiner* — Shannon M Gardner

(74) *Attorney, Agent, or Firm* — The Marbury Law Group PLLC

(57) ABSTRACT

A photovoltaic panel is formed by providing a plurality of photovoltaic cells electrically connected by interconnect structures between a front-side insulating sheet extending over the plurality of photovoltaic cells and a backside insulating sheet extending under the plurality of photovoltaic cells, adjoining an edge portion of the front-side insulating sheet to an edge portion of the backside insulating sheet in an adhesion region, and folding at least one of the front-side insulating sheet or the backside insulating sheet over peripheral photovoltaic cells of the plurality of photovoltaic cells.

2 Claims, 11 Drawing Sheets

(56) References Cited

U.S. PATENT DOCUMENTS

| | | | |
|---|---|---|---|
| 5,861,324 | A | 1/1999 | Ichinose et al. |
| 6,184,458 | B1 | 2/2001 | Murakami et al. |
| 6,231,732 | B1 | 5/2001 | Hollars et al. |
| 6,365,010 | B1 | 4/2002 | Hollars |
| 6,372,538 | B1 | 4/2002 | Wendt et al. |
| 6,479,744 | B1 | 11/2002 | Tsuzuki et al. |
| 6,488,824 | B1 | 12/2002 | Hollars et al. |
| 6,600,100 | B2 | 7/2003 | Ho et al. |
| 6,878,871 | B2 | 4/2005 | Scher et al. |
| 6,974,976 | B2 | 12/2005 | Hollars |
| 7,432,438 | B2 | 10/2008 | Rubin et al. |
| 7,507,903 | B2 | 3/2009 | Luch |
| 7,544,884 | B2 | 6/2009 | Hollars |
| 7,635,810 | B2 | 12/2009 | Luch |
| 7,772,484 | B2 | 8/2010 | Li et al. |
| 7,935,558 | B1 | 5/2011 | Juliano et al. |
| 8,134,069 | B2 | 3/2012 | Mackie |
| 8,734,619 | B1 | 5/2014 | Corson |
| 8,847,063 | B2 | 9/2014 | Terreau et al. |
| 8,912,429 | B2 | 12/2014 | Wudu et al. |
| 9,169,548 | B1 | 10/2015 | Corson et al. |
| 9,303,316 | B1 | 4/2016 | Shufflebotham et al. |
| 10,128,391 | B2 | 11/2018 | Corneille et al. |
| 2002/0179141 | A1 | 12/2002 | Ho et al. |
| 2004/0069340 | A1 | 4/2004 | Luch |
| 2004/0118448 | A1 | 6/2004 | Scher et al. |
| 2005/0072461 | A1 | 4/2005 | Kuchinski et al. |
| 2005/0109392 | A1 | 5/2005 | Hollars |
| 2005/0176270 | A1 | 8/2005 | Luch |
| 2005/0241692 | A1 | 11/2005 | Rubin et al. |
| 2005/0274408 | A1 | 12/2005 | Li et al. |
| 2006/0032752 | A1 | 2/2006 | Luch |
| 2006/0180195 | A1 | 8/2006 | Luch |
| 2006/0207646 | A1 | 9/2006 | Terreau et al. |
| 2007/0283996 | A1* | 12/2007 | Hachtmann ......... H01L 31/0508 136/244 |
| 2007/0283997 | A1 | 12/2007 | Hatchmann et al. |
| 2008/0053519 | A1 | 3/2008 | Pearce et al. |
| 2010/0258191 | A1 | 10/2010 | Mackie |
| 2017/0373204 | A1 | 12/2017 | Corneille et al. |

OTHER PUBLICATIONS

Untila, et al.,"19.2% Efficient Bifacial ITO-($P^+Nn^+$)Si-ITO Laminated Grid Cell," $16^{th}$ European Photovoltaic Solar Energy Conference, May 1-5, 2000, Glasgow, UK, pp. 1489-1491.

* cited by examiner

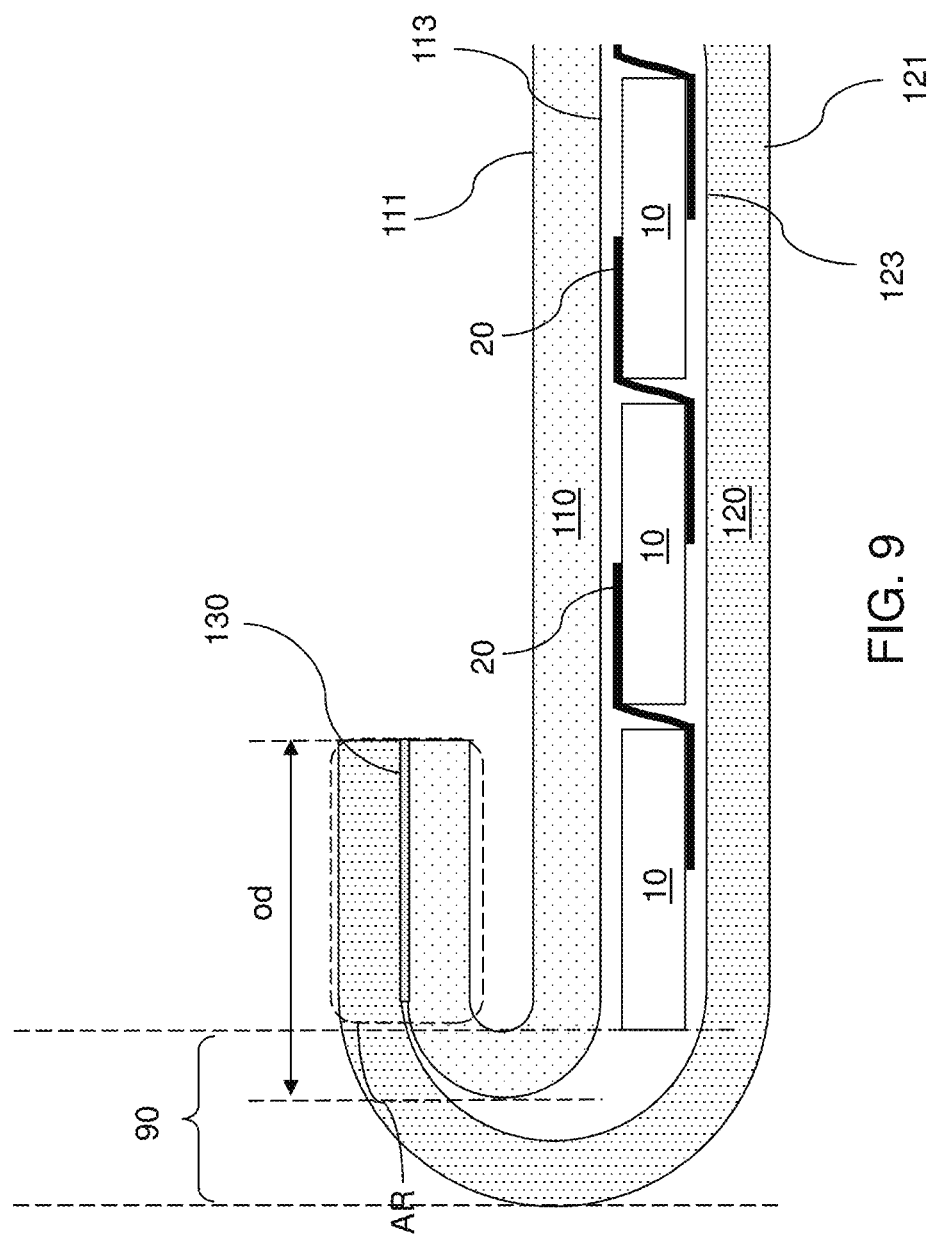

PHOTOVOLTAIC PANELS WITH FOLDED PANEL EDGES AND METHODS OF FORMING THE SAME

FIELD

The present disclosure is directed generally to photovoltaic devices, and specifically to photovoltaic panels with folded panel edges and methods of manufacturing the same.

BACKGROUND

A photovoltaic (i.e., solar) panel includes a plurality of photovoltaic cells that are electrically connected to each other by a conductive interconnect structure. The photovoltaic panel includes a front-side insulating sheet and a backside insulating sheet that protect the photovoltaic cells from the environment.

SUMMARY

According to an aspect of the present disclosure, a photovoltaic panel comprises a plurality of photovoltaic cells electrically connected by interconnect structures, a front-side insulating sheet extending over the plurality of photovoltaic cells, and a backside insulating sheet extending under the plurality of photovoltaic cells. An edge portion of the front-side insulating sheet is adjoined to an edge portion of the backside insulating sheet in an adhesion region, and at least one of the front-side insulating sheet or the backside insulating sheet is folded over peripheral photovoltaic cells of the plurality of photovoltaic cells.

According to another aspect of the present disclosure, a method of forming a photovoltaic panel comprises providing a plurality of photovoltaic cells electrically connected by interconnect structures between a front-side insulating sheet extending over the plurality of photovoltaic cells and a backside insulating sheet extending under the plurality of photovoltaic cells, adjoining an edge portion of the front-side insulating sheet to an edge portion of the backside insulating sheet in an adhesion region, and folding at least one of the front-side insulating sheet or the backside insulating sheet over peripheral photovoltaic cells of the plurality of photovoltaic cells.

BRIEF DESCRIPTION OF THE DRAWINGS

FIG. 9 is a vertical cross-sectional view of a region of a sixth exemplary configuration of the photovoltaic panel according to an embodiment of the present disclosure.

DETAILED DESCRIPTION

Figure 1:
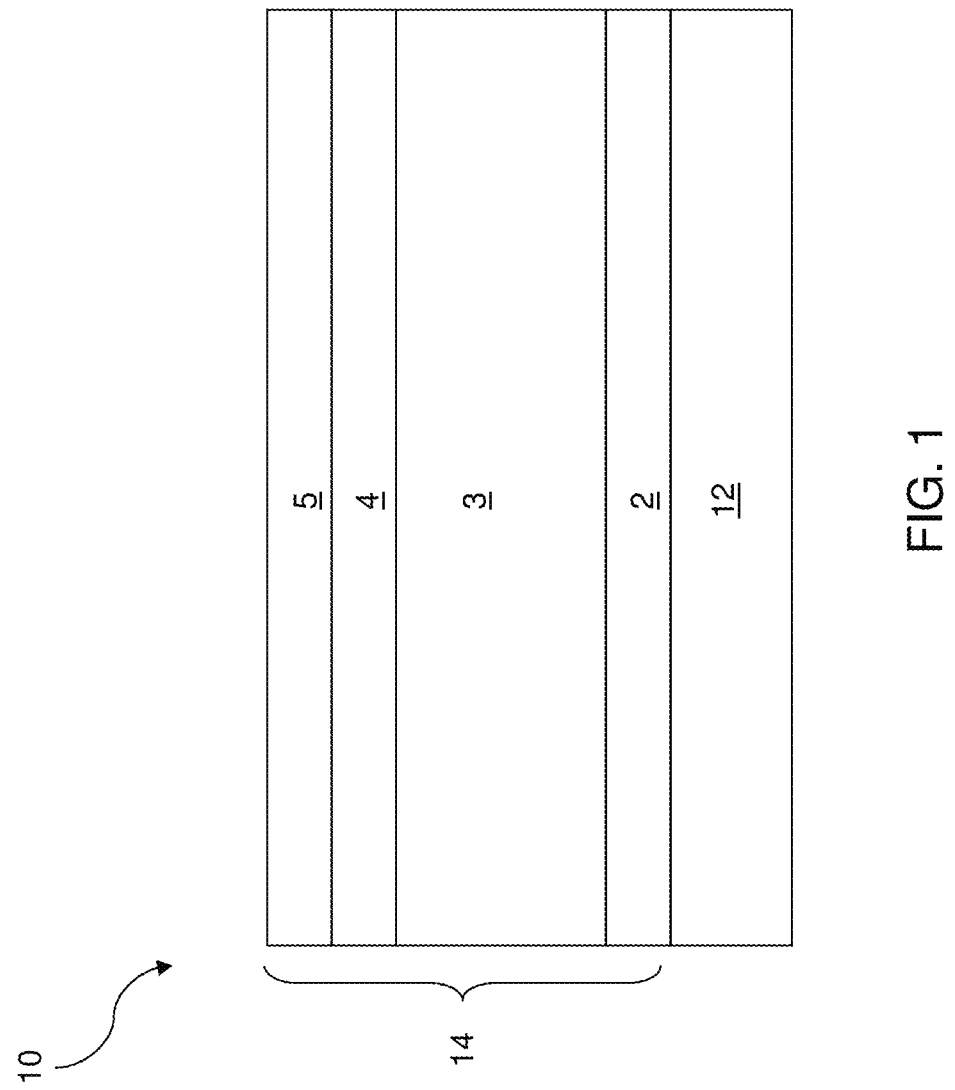
FIG. 1 illustrates a vertical cross-sectional view of an exemplary photovoltaic cell according to an embodiment of the present disclosure.

Same reference numerals in different figures refer to the same element or similar element having the same properties. Elements with the same reference numeral are presumed to include a same set of components and/or a same material composition. As used herein, the term "module" includes an assembly of at least two, and preferably three or more electrically interconnected photovoltaic cells, which may also be referred to as "solar cells." As used herein, a "photovoltaic panel" (also referred to as a solar panel) is a module of at least two photovoltaic cells that are encased within an electrically insulating cover structure. As used herein, a "conductive connector" refers to a connector consisting essentially of one or more electrically conductive materials. For example, the conductive connector may comprise a single continuous conductive wire, trace (e.g., a trace formed by coating a conductive ink on an underlying material), bar or strip. It is understood that a wire can gradually change the local lengthwise direction to provide a global topology including curved portions. As used herein, a "zig-zag conductive wire" refers to a conductive wire having straight portions having different local lengthwise directions and adjoined by connecting portions in which the local lengthwise direction changes. As used herein, an element is "transparent" if the element allows at least 50% of radiation at wavelength of 500 nm to pass through. As used herein, an element is "opaque" if the element allows less than 50% of radiation at wavelength of 500 nm to pass through.

Referring to FIG. 1, a photovoltaic cell 10 is illustrated, which includes a substrate, such as a conductive substrate 12, a first electrode 2, a p-doped semiconductor layer 3, an n-doped semiconductor layer 4, a second electrode 5, and an optional antireflective (AR) coating layer (not shown). The electrodes 2 and 5, the p-doped semiconductor layer 3, the n-doped semiconductor layer 4, and the optional AR coating layer are collectively referred to as a photovoltaic film stack 14, which is a stack of various films that form a photovoltaic structure.

The conductive substrate 12 is preferably a flexible, electrically conductive material, such as a metallic foil that is fed into a system of one or more process modules as a web for deposition of additional layers thereupon. For example, the metallic foil of the conductive substrate 12 can be a sheet of a metal or a metallic alloy such as stainless steel, aluminum, or titanium. If the conductive substrate 12 is electrically conductive, then it may comprise a part of the backside (i.e., first) electrode of the photovoltaic cell 10. Thus, the first (backside) electrode of the photovoltaic cell 10 may be designated as (2, 12). Alternatively, the substrate 12 may be an electrically conductive or insulating polymer foil. Still alternatively, the substrate 12 may be a stack of a polymer foil and a metallic foil. The thickness of the substrate 12 can be in a range from 100 microns to 2 mm, although lesser and greater thicknesses can also be used.

The first or backside electrode 2 may comprise any suitable electrically conductive layer or stack of layers. For example, electrode 2 may include a metal layer, which may be, for example, molybdenum. Alternatively, a stack of molybdenum and sodium and/or oxygen doped molybdenum layers may be used instead, as described in U.S. Pat. No. 8,134,069, which is incorporated herein by reference in its entirety. The electrode 2 can have a thickness in a range from 500 nm to 1 micron, although lesser and greater thicknesses can also be employed.

The p-doped semiconductor layer 3 can include a p-type, sodium doped copper indium gallium selenide (CIGS), which functions as a semiconductor absorber layer. The thickness of the p-doped semiconductor layer 3 can be in a range from 1 micron to 5 microns, although lesser and greater thicknesses can also be employed.

The n-doped semiconductor layer 4 includes an n-doped semiconductor material such as CdS, ZnS, ZnSe, or an alternative metal sulfide or a metal selenide. The thickness of the n-doped semiconductor layer 4 is typically less than the thickness of the p-doped semiconductor layer 3, and can be in a range from 50 nm to 100 nm, although lesser and greater thicknesses can also be employed. The junction between the p-doped semiconductor layer 3 and the n-doped semiconductor layer 4 is a p-n junction. The n-doped semiconductor layer 4 can be a material which is substantially transparent to at least part of the solar radiation. The n-doped semiconductor layer 4 is also referred to as a window layer or a buffer layer.

The second (e.g., front side or top) electrode 5 comprises one or more transparent conductive layers 5. The transparent conductive layer 5 is conductive and substantially transparent. The transparent conductive layer 5 can include one or more transparent conductive materials, such as ZnO, indium tin oxide (ITO), Al doped ZnO ("AZO"), or a combination or stack of higher resistivity AZO and lower resistivity ZnO, ITO and/or AZO layers.

The optional antireflective coating layer (not shown) is an optional layer. If present, the antireflective coating layer can decrease the amount of light that is reflected off the top surface of the photovoltaic cell, which is the surface that is located on the opposite side of the substrate 12. In one embodiment, the antireflective coating layer can be deposited directly on the top surface of the second electrode 5. Alternatively or additionally, a transparent cover glass can be disposed over the photovoltaic cell in a final product, and an antireflective coating layer can be formed on either side, or on both sides, of the transparent cover glass.

Figure 2A:
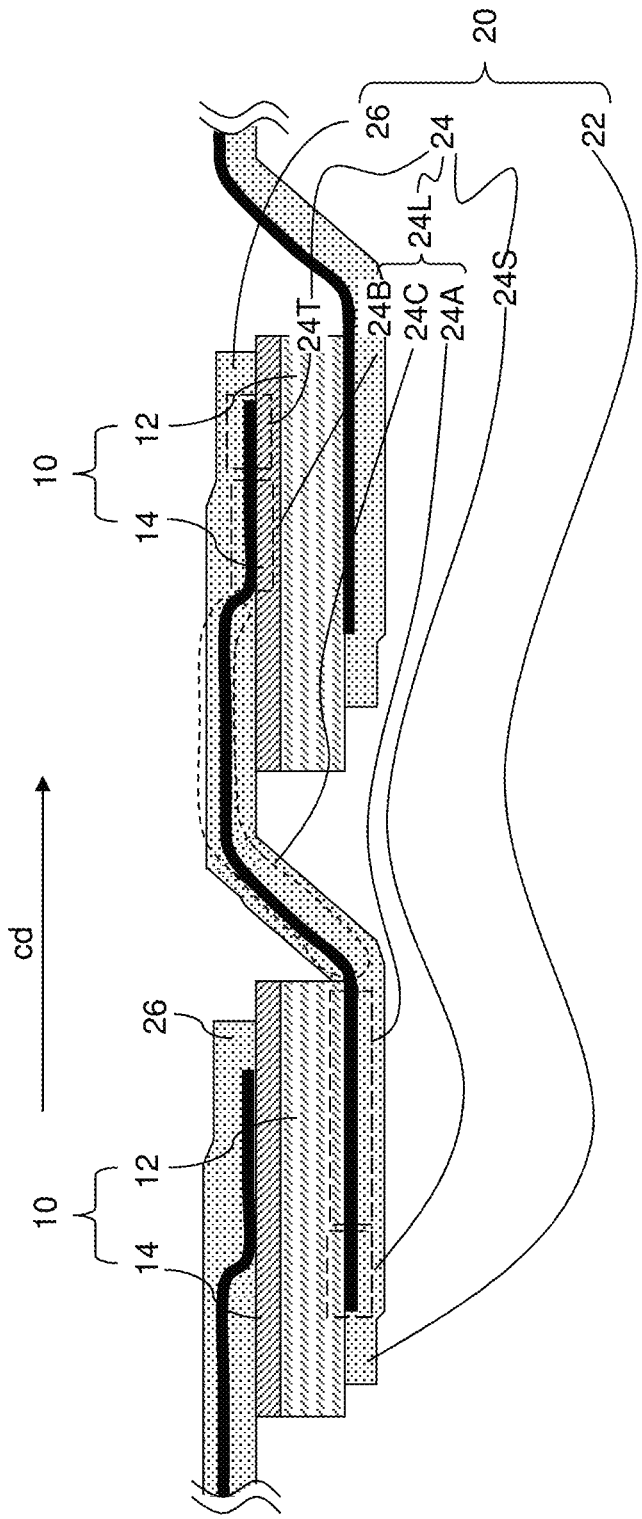
FIG. 2A is a vertical cross-sectional view of photovoltaic cells connected through interconnect structures according to an embodiment of the present disclosure.
Figure 2B:
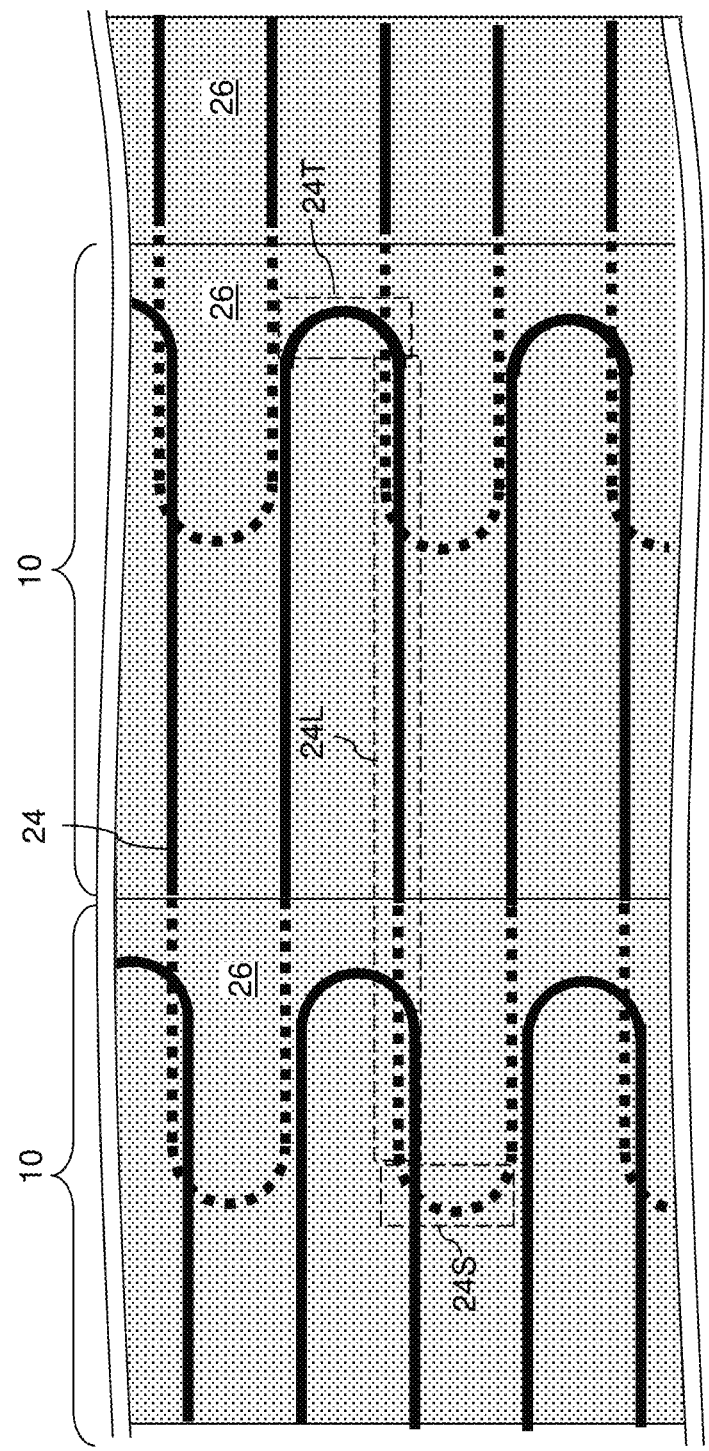
FIG. 2B is a top-down view of the photovoltaic cells and the interconnect structures of FIG. 2A.

Referring to FIGS. 2A and 2B, an assembly of photovoltaic cells 10 can be formed by connecting the photovoltaic cells 10 with interconnect structures (i.e., interconnects) 20. While the present disclosure is described employing a specific embodiment for the interconnect structures 20, the present invention can be practiced with any configuration of connection structures that can provide suitable electrical connections between the photovoltaic cells 10. The photovoltaic cells 10 can be arranged along a connection direction cd (such as the horizontal direction in FIG. 2A and the horizontal direction in FIG. 2B) after being interconnected by the interconnect structures 20.

Each of the interconnect structure 20 can include a conductive connector 24, such as a zig-zag conductive wire 24 and a respective flexible transparent insulating sheets 22 and 26. Each zig-zag conductive wire 24 is attached to the bottom surface of a respective first photovoltaic cell (which may a bottom surface of the conductive substrate 12 if the substrate is electrically conductive) and to the top surface of a respective second photovoltaic cell (which is a top surface of the second electrode 5 of the second photovoltaic cell).

Each zig-zag conductive wire 24 can be manufactured by providing a straight wire or a wound wire, and by bending various sections to form bending portions (24S, 24T), which include first bending portions 24S and second bending portions 24T. In one embodiment, the first bending portions 24S include each odd-numbered bent portion as counted from one side of a respective zig-zag conductive wire 24 and the second bending portions 24T include each even-numbered bent portion as counted from the same side of the respective zig-zag conductive wire 24. Alternatively, the first bending portions 24S include each even-numbered bent portion as counted from one side of a respective zig-zag conductive wire 24 and the second bending portions 24T include each odd-numbered bent portion as counted from the same side of the respective zig-zag conductive wire 24.

Each zig-zag conductive wire 24 can be attached to the first (e.g., backside or bottom) electrode (2, 12) of the first photovoltaic cell 10 and the second (e.g., front side or top) electrode 5 of the second photovoltaic cell 10 within each respective neighboring pair of photovoltaic cells using at least one additional structure that has an electrically insulating surface that is connected to the bottom surface of the first electrode of the first photovoltaic cell or to the top surface of the second electrode of the second photovoltaic cell. The at least one additional structure may have an adhesive surface, comprise an adhesive material or have an adhesive material placed between its surface and the electrode to connect the at least one additional structure to the electrode. Alternatively or additionally, each zig-zag conductive wire 24 can be attached to the first electrode of the first photovoltaic cell and the second electrode of the second photovoltaic cell within each respective neighboring pair of photovoltaic cells employing a conductive adhesive material (such as a conductive paste or glue).

Each zig-zag conductive wire 24 comprises a plurality of substantially linear portions 24L, first bending portions 24S that contact a first electrode (2, 12) of the first photovoltaic cell, and second bending portions 24T that contact a second electrode 5 of the second photovoltaic cell. The first bending portions 24S adjoin neighboring pairs of the plurality of substantially linear (e.g., straight) portions 24L underneath the first electrode (2, 12) of the first photovoltaic cell. The second bending portions 24T adjoin neighboring pairs of the plurality of substantially linear portions 24L over the second electrode 5 of the second photovoltaic cell.

Each of the plurality of substantially linear portions 24L comprises a first end portion 24A that underlies and contacts the first electrode (2, 12) of the first photovoltaic cell, a second end portion 24B that overlies and contacts the second electrode 5 of the second photovoltaic cell, and a connection portion 24C that connects the first end portion 24A and the second end portion 24B and does not directly contact the first or second photovoltaic cells 10. In one embodiment, each substantially linear portion 24L can extend farther along the connection direction cd than along any direction that is perpendicular to the connection direction cd. In an alternative configuration, only the bending portions 24S and 24T underlie or overlie the photovoltaic cells 10 and end portions 24A and 24B are omitted.

In one embodiment, each of the first and second bending portions (24S, 24T) can change a propagation direction of the respective zig-zag conductive wire 24 by a range from 90 degrees to 270 degrees. In one embodiment, each of the first and second bending portions (24S, 24T) can change a propagation direction of the respective zig-zag conductive wire 24 by an angle that is substantially 180 degrees.

In one embodiment, each neighboring pair of photovoltaic cells 10 can be physically adjoined to each other through bonded, overlapping flexible transparent insulating sheets 22 and 26. In one embodiment, the flexible transparent insulating sheets 22 and 26 can include a transparent polymeric film, a transparent non-polymeric film, a transparent oligomer film, or a combination thereof. The flexible transparent insulating sheets can have an adhesive coating on each side that contacts the photovoltaic cells 10. The flexible transparent insulating sheets 22 and 26 can be attached to at least one photovoltaic cell 10 by an adhesive material or an adhesive surface of the flexible transparent insulating sheets. In an alternative embodiment, the flexible transparent insulating sheets 22 and 26 may comprise a pressure sensitive adhesive (PSA) flexible transparent insulating sheet.

In one embodiment, each second bending portion 24T can be contacted by a bottom surface of a respective overlying (e.g., second) transparent insulating sheet 26 that laterally extends along a direction that is substantially perpendicular to the connection direction cd and overlaps the underlying (e.g., first) transparent insulating sheet 22.

Figure 3A:
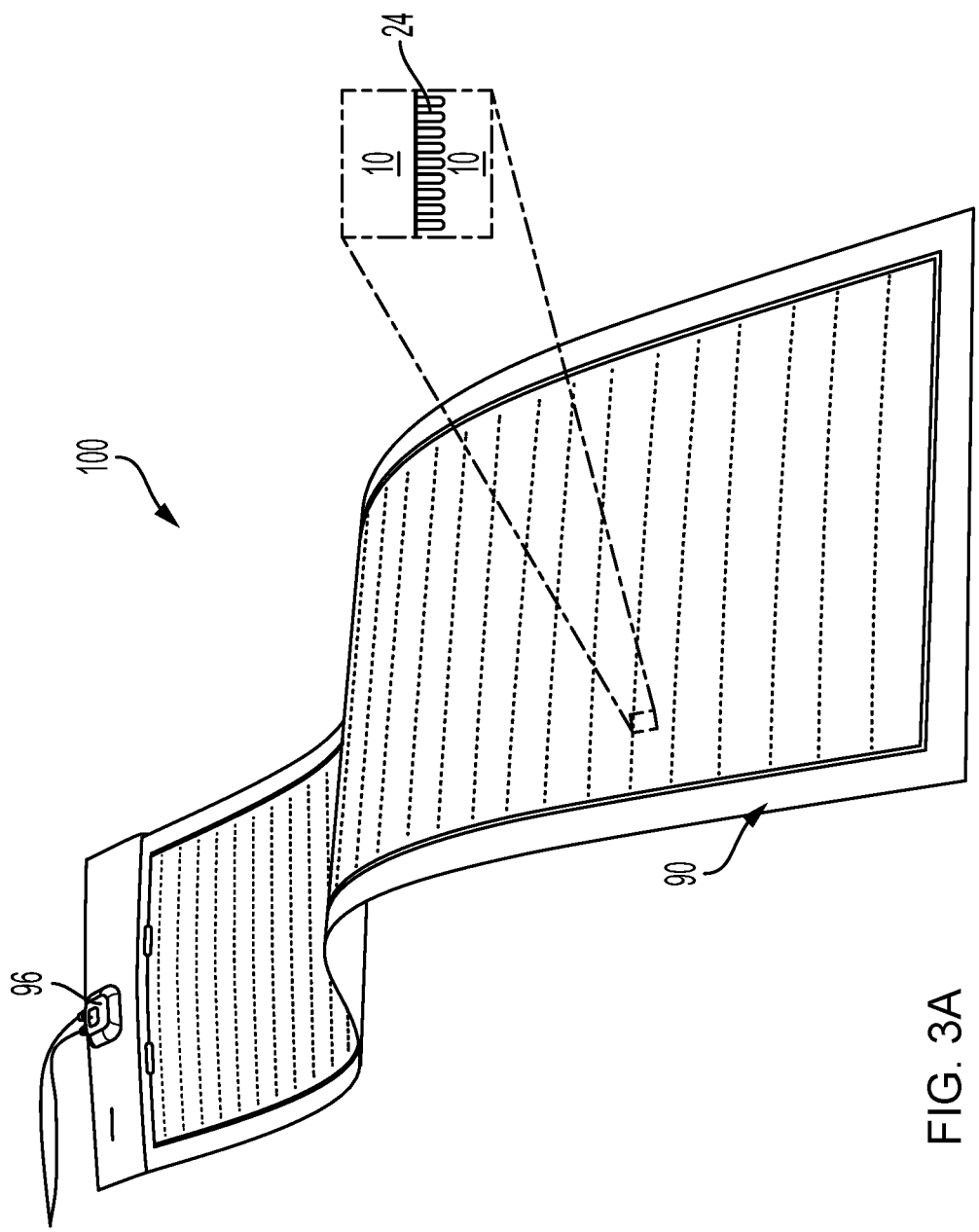
FIG. 3A is a bird's eye view of an exemplary photovoltaic panel according to an embodiment of the present disclosure.
Figure 3B:
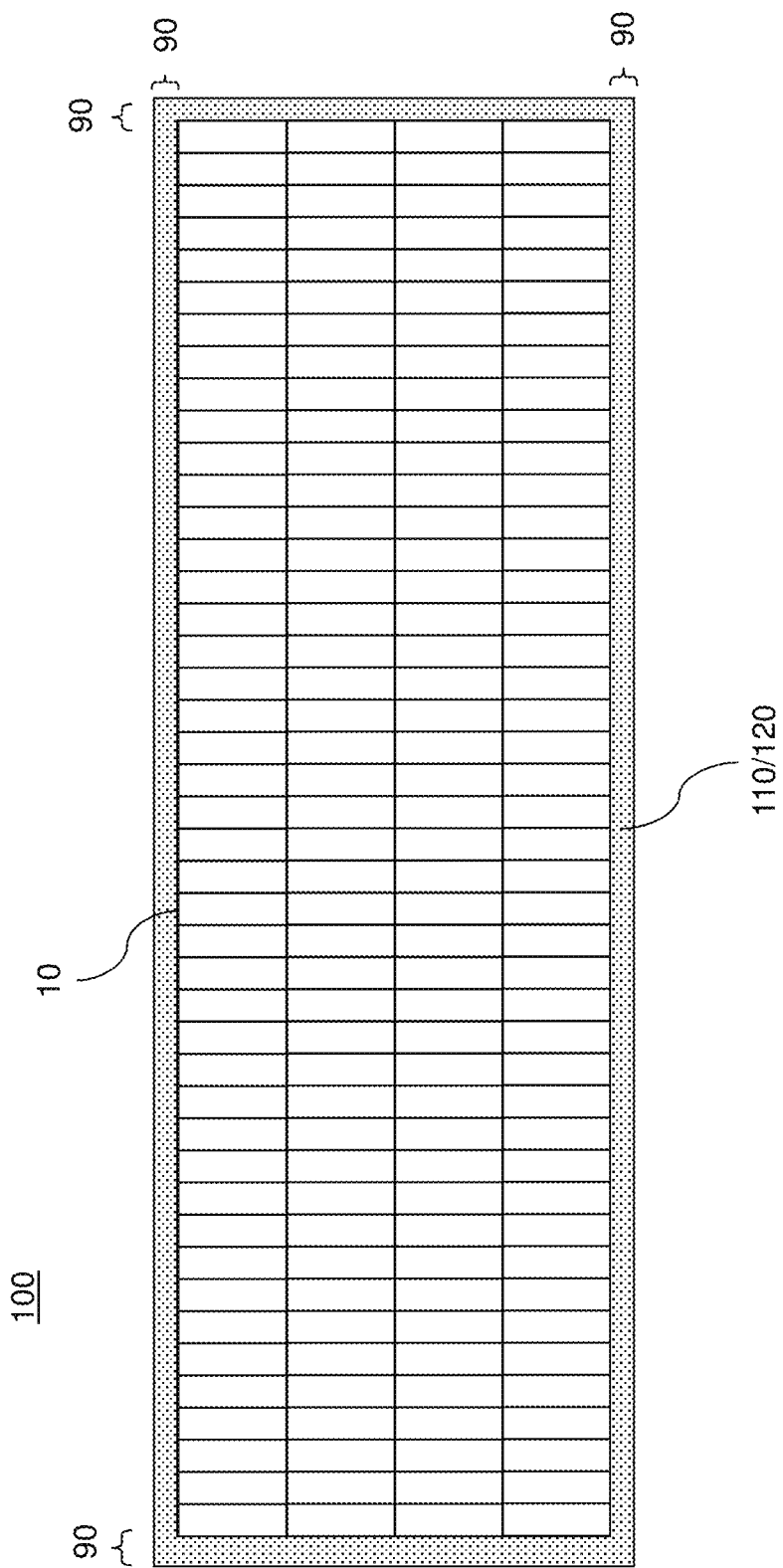
FIG. 3B is a plan view of the exemplary photovoltaic panel of FIG. 3A.

Referring to FIGS. 3A and 3B, an exemplary photovoltaic panel 100 including an assembly of photovoltaic cells 10 connected by interconnect structures 20 is illustrated. The assembly of photovoltaic cells 10 can be arranged as a one-dimensional periodic array or as a two-dimensional periodic array. A subset of the interconnect structures 20 can be connected in a series connection such that the interconnected subset of photovoltaic cells 10 generates a direct current (DC) voltage in a range from 12 V to 15 V, although lower and higher DC output voltages can also be employed. Multiple interconnected subsets of photovoltaic cells 10 may be connected in parallel to increase the current output in the assembly of photovoltaic cells 10. A voltage output interface 96 can be provided to provide an output of the photovoltaic panel 100 to an external circuit, which can include a power storage system or an electrical load.

The assembly of photovoltaic cells 10 are encapsulated within a combination of a front-side insulating sheet 110 and a backside insulating sheet 120 to electrically isolate the assembly of photovoltaic cells 10 from the environment. Further, the combination of the front-side insulating sheet 110 and the backside insulating sheet 120 protects the assembly of photovoltaic cells 10 from mechanical damage and from exposure to ambient moisture or various external elements. The front-side insulating sheet 110 is optically transparent, and the backside insulating sheet 120 may be optically transparent or opaque. The thickness of the front-side insulating sheet 110 can be in a range from 0.3 cm to 3 cm, although lesser and greater thicknesses can also be employed for the front-side insulating sheet 110. The thickness of the backside insulating sheet 120 can be in a range from 0.3 cm to 3 cm, although lesser and greater thicknesses can also be employed for the backside insulating sheet 120. At least one of the front-side insulating sheet 110 and/or the backside insulating sheet 120 may be made of any flexible, electrically insulating and water resistant material, such as a polymer material. Polymer materials include non-olefin thermoplastic polymers or thermoplastic polyolefin (TPO). Particular examples include, but are not limited to, polyethylene, polypropylene, polybutylene, polyethylene terephthalate (PET), polybutylene terephthalate (PBT), polystyrene, polycarbonates, fluoropolymers, acrylics, ionomers, silicones and combinations thereof.

The front-side insulating sheet 110 and the backside insulating sheet 120 collectively constitute an electrically insulating cover structure of the photovoltaic panel 100. Government regulations require a minimum distance along a surface or an interface between active components (such as the photovoltaic cells 10 and the interconnect structures 20) and the external environment. This requirement typically results in an inactive adhesion area (e.g., a buffer area) at the edge of a photovoltaic panel 100 that does not include any photovoltaic cell 10 or any interconnect structure 20.

According to an aspect of the present disclosure, the total area of an edge region 90 that is free of any photovoltaic cell 10 or any interconnect structure 20 can be reduced while maintaining the minimum distance along any surface or any interface between active components of the photovoltaic panel 100 and the external environment. The inactive area around the outermost photovoltaic cells 10 is not utilized for generation of solar power, resulting in inefficient utilization of the total area of the photovoltaic panel. Various embodiment configurations for the combination of the front-side insulating sheet 110 and the backside insulating sheet 120 in which one or both of the insulating sheets folded at the edge region are described in detail below. These embodiment configurations reduce the total area of an edge region 90 the photovoltaic panel 100 such that edge photovoltaic cells 10 of adjacent photovoltaic panels 100 are located closer to each other, thus improving the space utilization of the underlying roof or another support and increasing the ratio of photovoltaic cell 10 area to the total area of the photovoltaic panels 100.

In the embodiments described below, a method of forming the photovoltaic panel 100 includes providing a plurality of photovoltaic cells 10 electrically connected by interconnect structures 20 between a front-side insulating sheet 110 extending over the plurality of photovoltaic cells 10 and a backside insulating sheet 120 extending under the plurality of photovoltaic cells, adjoining an edge portion of the front-side insulating sheet 110 to an edge portion of the backside insulating sheet 120 in an adhesion region AR, and folding at least one of the front-side insulating sheet 110 or the backside insulating sheet 120 over peripheral photovoltaic cells of the plurality of photovoltaic cells 10.

FIGS. 4 to 9 illustrate first through sixth embodiments of the photovoltaic panel 100, respectively. The insulating sheets 110 and 120 are illustrated with different shading in FIGS. 4 to 9 to more clearly show the boundary between these sheets. The different shading should not be construed to imply that the backside insulating sheet 120 must be opaque, since the backside insulating sheet may be either transparent or opaque. In the first and second embodiments illustrated in FIGS. 4 and 5, respectively, edges of one of the insulating sheets 110 or 120 are folded over the peripheral photovoltaic cells 10 between the peripheral photovoltaic cells 10 and the edges of the other one of the insulating sheets 110 or 120. For example, in the first embodiment illustrated in FIG. 4, edges of front-side insulating sheet 110 are folded over the peripheral photovoltaic cells 10 between the back side of the peripheral photovoltaic cells 10 and proximal (i.e., top) surface 123 of the edges of the backside insulating sheet 120. In the second embodiment illustrated in FIG. 5, edges of backside insulating sheet 120 are folded over the peripheral photovoltaic cells 10 between the front side of the peripheral photovoltaic cells 10 and proximal (i.e., bottom) surface 113 of the edges of the front-side insulating sheet 110.

Figure 6:
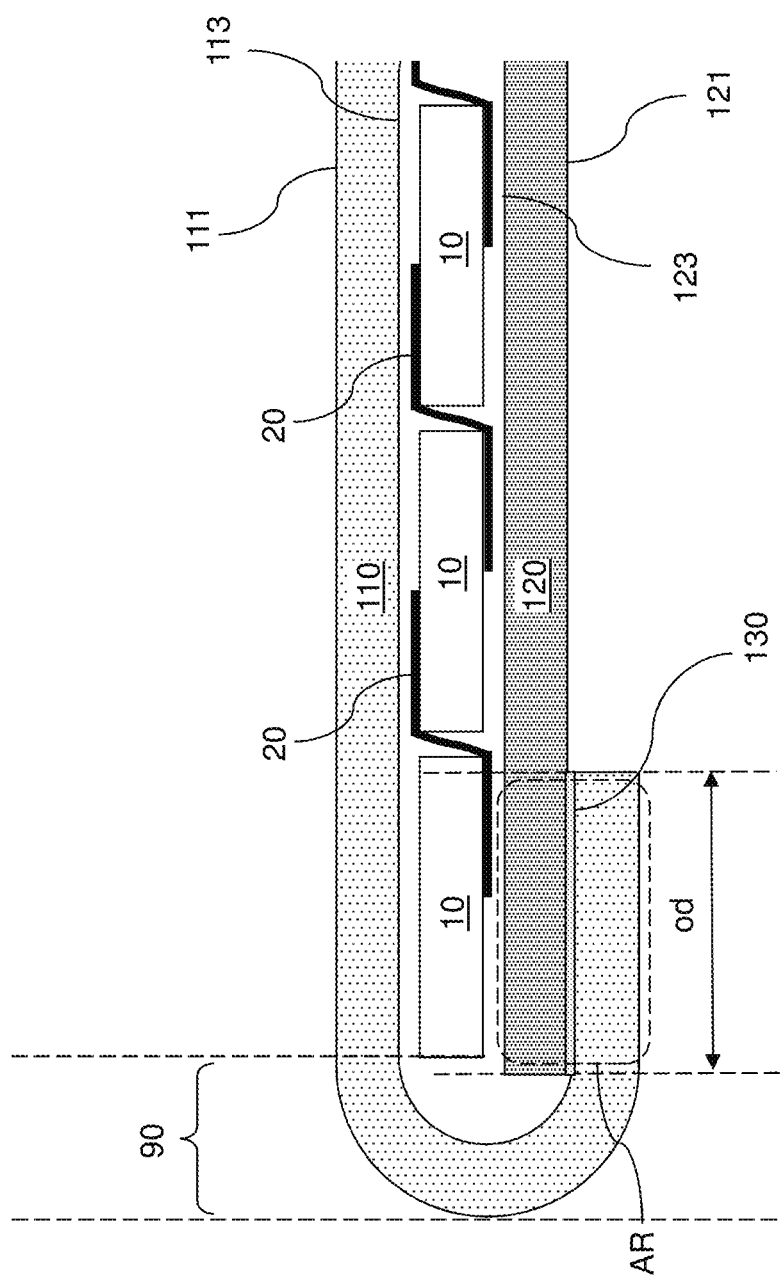
FIG. 6 is a vertical cross-sectional view of a region of a third exemplary configuration of the photovoltaic panel according to an embodiment of the present disclosure.
Figure 7:
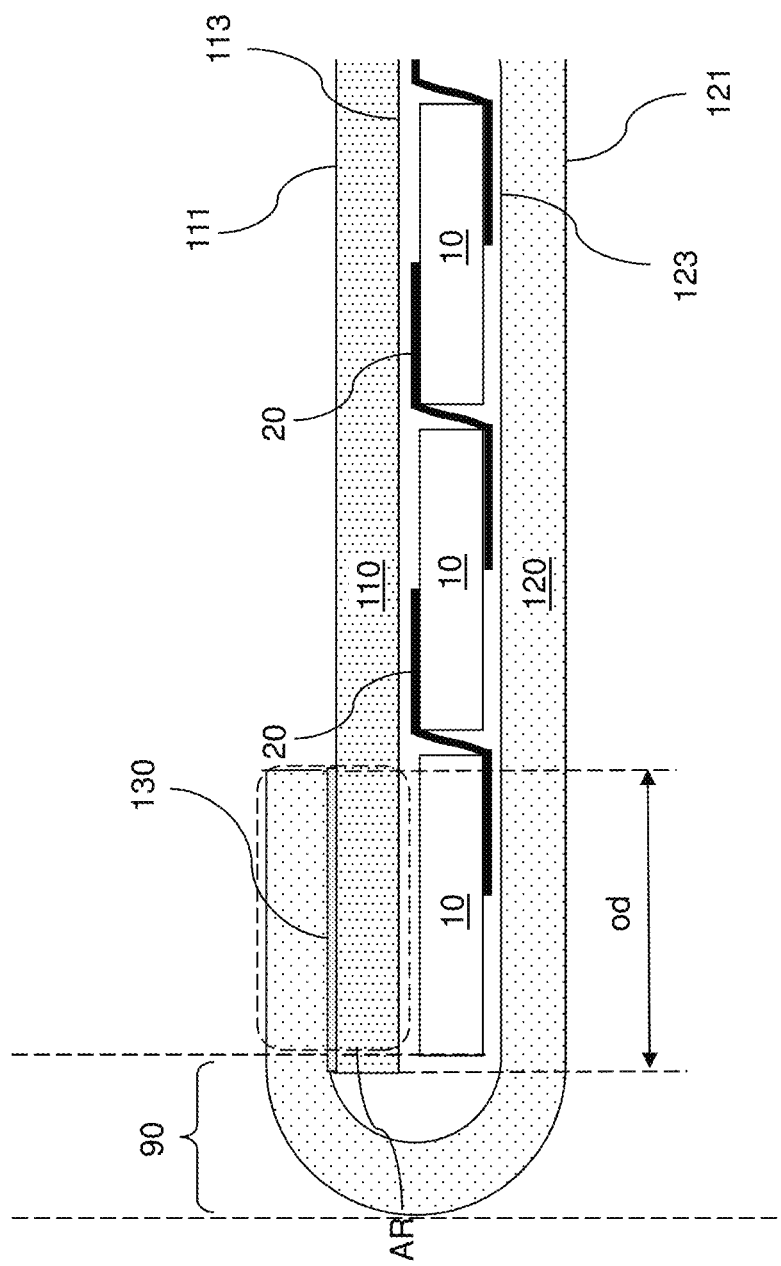
FIG. 7 is a vertical cross-sectional view of a region of a fourth exemplary configuration of the photovoltaic panel according to an embodiment of the present disclosure.

In the third and fourth embodiments illustrated in FIGS. 6 and 7, respectively, edges of one of the insulating sheets 110 or 120 are folded over the peripheral photovoltaic cells 10 and over the edges of the other one of the insulating sheets 110 or 120. For example, in the third embodiment illustrated in FIG. 6, edges of front-side insulating sheet 110 are folded over the back side of the peripheral photovoltaic cells 10 and over the distal (i.e., bottom) surface 121 of the edges of the backside insulating sheet 120. In the fourth embodiment illustrated in FIG. 7, edges of backside insulating sheet 120 are folded over the front side of the peripheral photovoltaic cells 10 and over the distal (i.e., top) surface 111 of the edges of the front-side insulating sheet 110.

Figure 8:
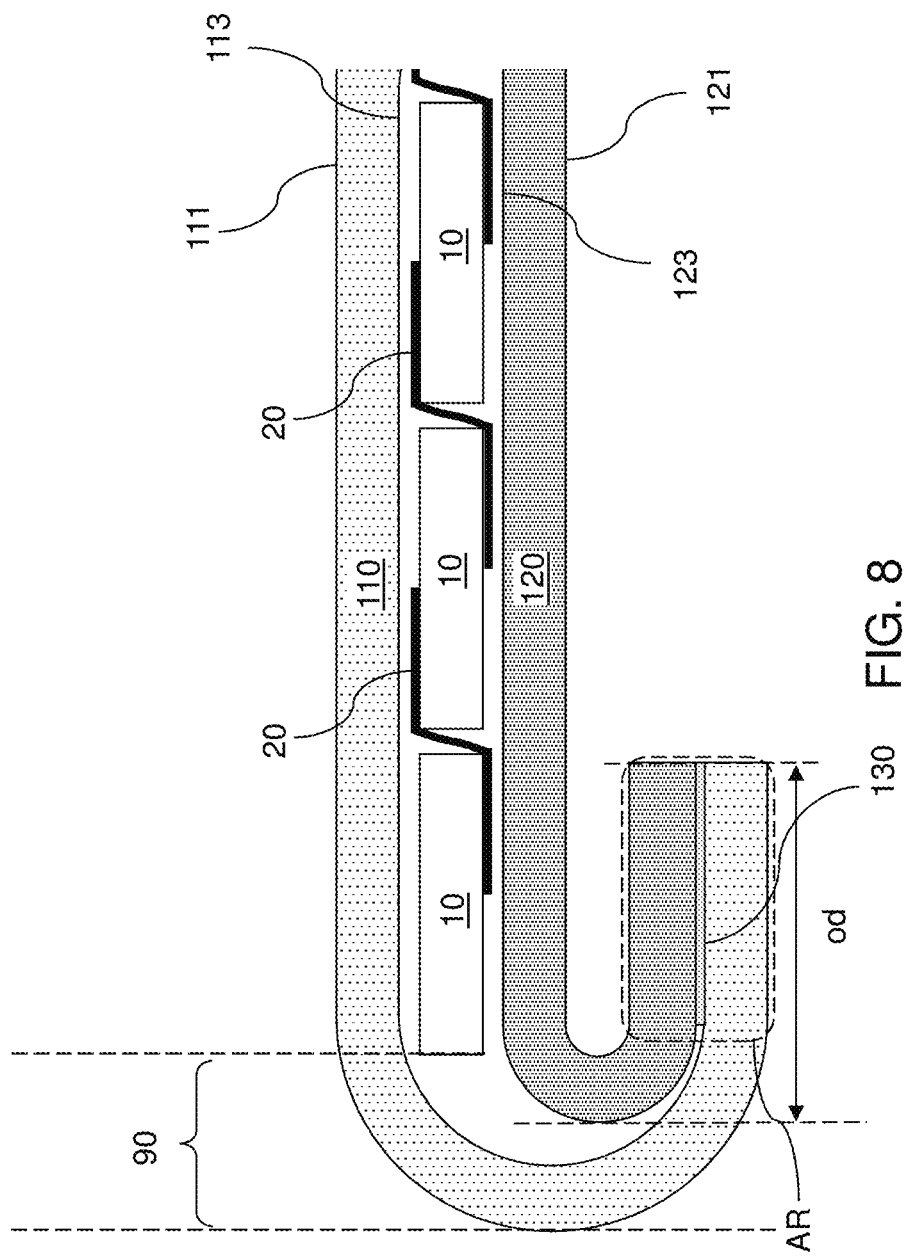
FIG. 8 is a vertical cross-sectional view of a region of a fifth exemplary configuration of the photovoltaic panel according to an embodiment of the present disclosure.

In the fifth and sixth embodiments illustrated in FIGS. 8 and 9, respectively, edges of both of the insulating sheets 110 and 120 are folded over the peripheral photovoltaic cells 10. For example, in the fifth embodiment illustrated in FIG. 8, edges of front-side insulating sheet 110 and the backside insulating sheet 120 are folded over the back side of the peripheral photovoltaic cells 10. In the sixth embodiment illustrated in FIG. 9, edges of front-side insulating sheet 110 and the backside insulating sheet 120 are folded over the front side of the peripheral photovoltaic cells 10.

Figure 4:
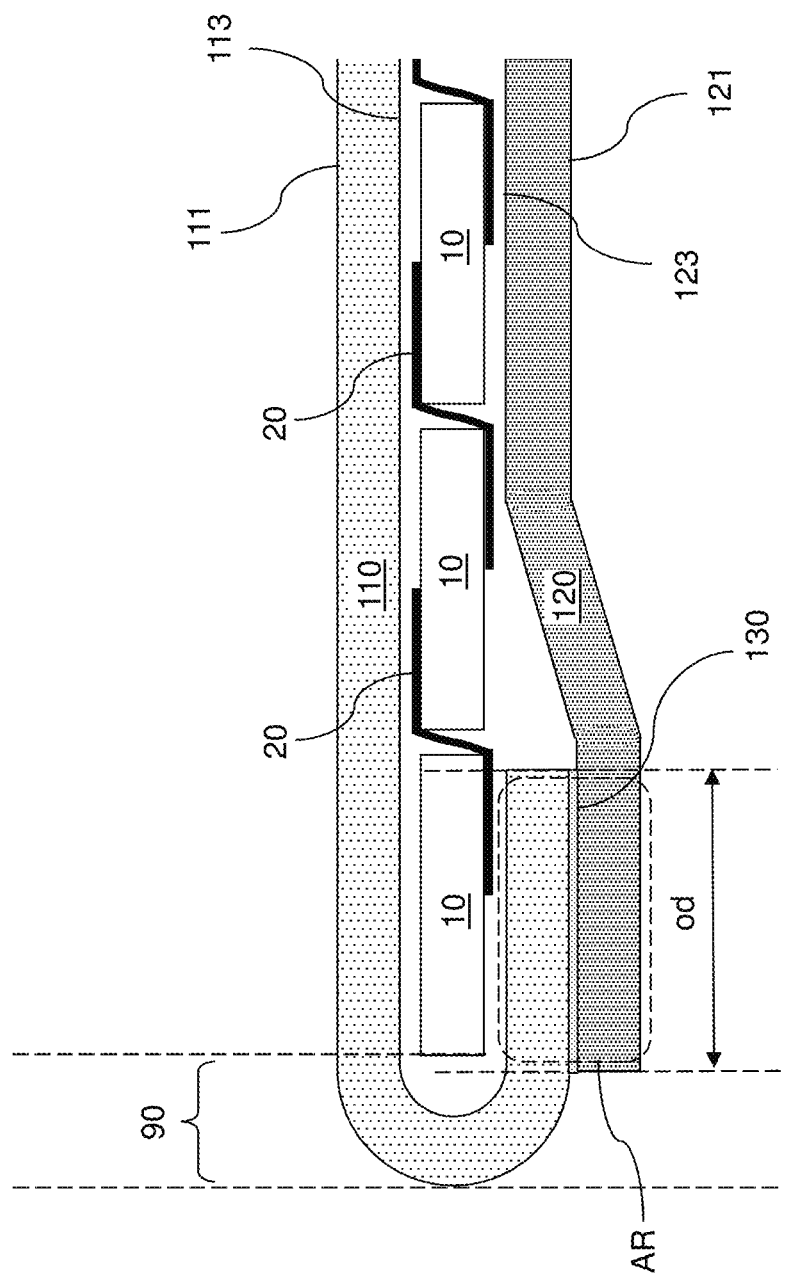
FIG. 4 is a vertical cross-sectional view of a region of a first exemplary configuration of the photovoltaic panel according to an embodiment of the present disclosure.
Figure 5:
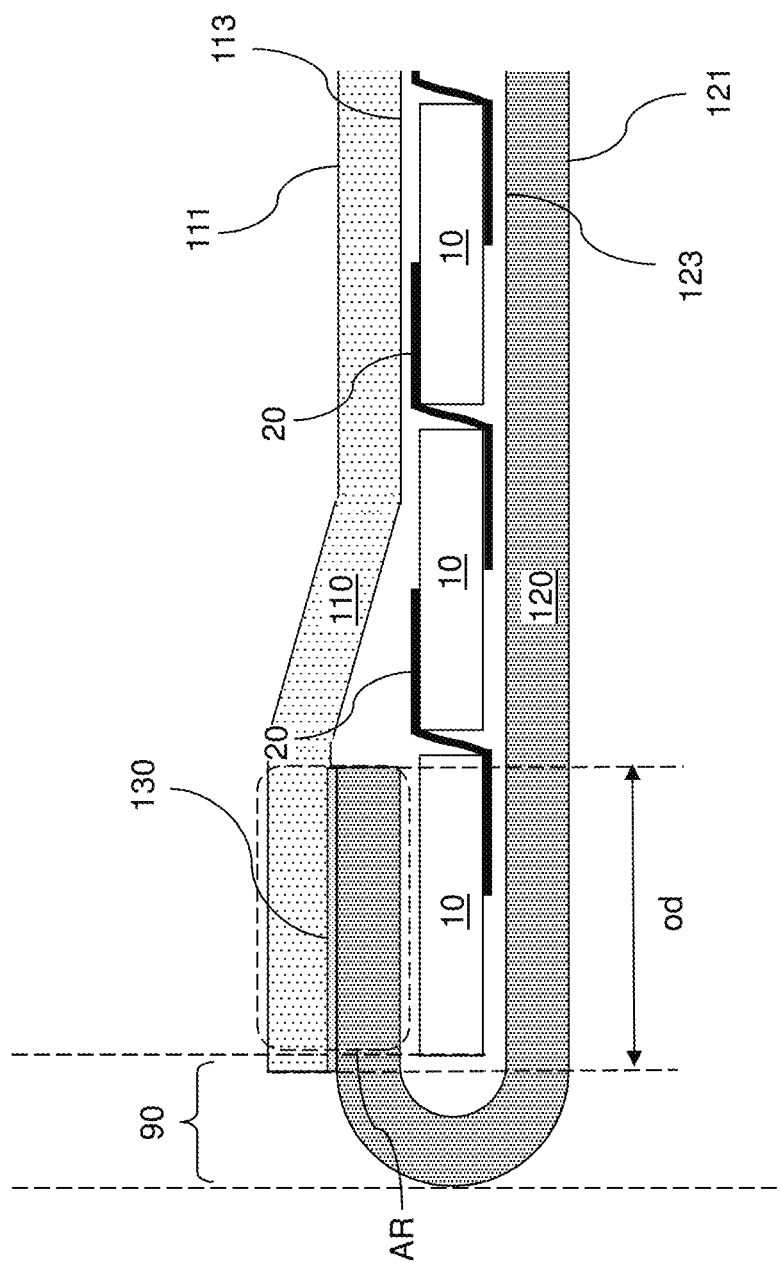
FIG. 5 is a vertical cross-sectional view of a region of a second exemplary configuration of the photovoltaic panel according to an embodiment of the present disclosure.

The above described first through sixth embodiments will now be described in more detail. Referring to FIGS. 4 and 5, a first exemplary configuration and a second exemplary configuration of the photovoltaic panel 100 are illustrated in a respective vertical cross-sectional view. An assembly of photovoltaic cells 10 includes a plurality of photovoltaic cells 10 that are interconnected by the interconnect structures 20. A first insulating sheet is disposed over one side of the plurality of photovoltaic cells 10, and a second insulating sheet is disposed over another side of the plurality of photovoltaic cells 10. In the first configuration illustrated in FIG. 4, the first insulating sheet is the front-side insulating sheet 110 and the second insulating sheet is the backside insulating sheet 120. In the second configuration illustrated in FIG. 5, the first insulating sheet is the backside insulating sheet 120 and the second insulating sheet is the front-side insulating sheet 110.

In one embodiment, the front-side surfaces (i.e., the Sun facing surfaces) of the peripheral photovoltaic cells 10 face a major planar surface of the first insulating sheet (110 or 120). As used herein, a "planar surface" refers to any surface that is locally parallel to a most proximal top surface within the assembly of photovoltaic cells 10. As used herein, a "major planar surface" of an element refers to a planar surface of that element that has an area of at least 50% of the largest planar surface of the element. In one embodiment, the front-side surfaces of the peripheral photovoltaic cells 10 face a major planar surface of the second insulating sheet (120 or 110). The major planar surfaces of the front-side insulating sheet 110 include a planar portion, i.e., a flat portion, of a front-side-sheet distal surface 111 and a planar portion of a front-side-sheet proximal surface 113. The major planar surfaces of the backside insulating sheet 120 include a planar portion of a backside-sheet distal surface 121 and a planar portion of a backside-sheet proximal surface 123.

In one embodiment, the first insulating sheet has a greater area than the total area of the second insulating sheet. The area of the first insulating sheet can be greater than the total area of the assembly of photovoltaic cells 10. The first insulating sheet can be aligned over a first side of the assembly of photovoltaic cells 10 such that peripheral portions of the first insulating sheet extend outside the periphery of the assembly of photovoltaic cells 10. The first side of the assembly of photovoltaic cells 10 may be the front side or the backside of the assembly of the photovoltaic cells. The lateral extension distance by which an edge of the first insulating sheet extends outward relative to a proximal edge of the assembly of photovoltaic cells 10 can be at least the sum of the thickness of the assembly of photovoltaic cells 10 and an overlap distance od, which is the width of a strip region in which the first insulating sheet and the second insulating sheet contact each other, directly or through an adhesion material layer 130 upon bonding. For example, the lateral extension distance can be, for example, in a range from 0.5 cm to 10 cm, such as from 1 cm to 5 cm, although lesser and greater lateral extension distances can also be employed.

In the first and second embodiments, the second insulating sheet can have approximately the same area as, or a smaller area than, the total area of the total area of the assembly of photovoltaic cells 10. The second insulating sheet can be aligned over a second side of the assembly of photovoltaic cells 10 such that edges of the second sheet are disposed at, or within, the periphery of the assembly of photovoltaic cells 10. The second side of the assembly of photovoltaic cells 10 is the opposite side of the first side. Thus, if the first side is the front side, the second side is the backside, and vice versa.

The edge portions of the first insulating sheet can be curled (i.e., folded) around a respective proximal edge (i.e., an edge that is proximal to a respective edge portion) of the assembly of photovoltaic cells 10 to the second side, i.e., to the side of the second insulating sheet. The radius of curvature of the inner surface of the first insulating sheet around the edge of the assembly of photovoltaic cells 10 may vary, or may be constant. The radius of curvature of the inner surface of the first insulating sheet can be in a range from 0.5 times the thickness of the assembly of photovoltaic cells 10 to 3 times the thickness of the assembly of photovoltaic cells 10, such as from 0.6 times the thickness of the assembly of photovoltaic cells 10 to 1.0 times the thickness of the assembly of photovoltaic cells 10. The curled edge portion of the first insulating sheet can be disposed directly on a peripheral region of the second side of the assembly of photovoltaic cells 10. The edge portion of the second insulating sheet can be placed over, and pressed against, the curled (i.e., folded) edge portions of the first insulating sheet with an adhesion material layer 130 therebetween. The curled edge portion of the first insulating sheet can be attached to the edge portion of the second insulating sheet while the curled edge portion of the first insulating sheet is disposed between the edge portion of the second insulating sheet and the plurality of photovoltaic cells 10.

The region in which the first insulating sheet is attached to the second insulating sheet is herein referred to as an adhesion region AR. An edge portion of the first insulating sheet is adjoined to an edge portion of the second insulating sheet in the adhesion region AR. The adhesion region AR has an areal overlap with peripheral photovoltaic cells 10 within the plurality of photovoltaic cells 10 in a view along a direction perpendicular to front-side surfaces of the peripheral photovoltaic cells 10 (such as the plan view of FIG. 3B). The areal overlap can extend around an entire periphery of the assembly of photovoltaic cells 10. The curled edge portions of the first insulating sheet may be bonded to the edge portions of the second insulating sheet through the adhesion material layer 130, or may be directly bonded to the edge portion of the second insulating sheet by applying heat to the overlap region and inducing polymer bonding between the first insulating sheet and the second insulating sheet.

In the configurations illustrated in FIGS. 4 and 5, each edge portion of the first insulating sheet is curled (i.e., folded) around an edge of the plurality of photovoltaic cells to a side of the second insulating sheet. The edge portion of the first insulating sheet is more proximal to the assembly of photovoltaic cells 10 than the edge portion of the second insulating sheet is to the assembly of photovoltaic cells 10 in the adhesion region AR. In one embodiment, the edge portion of the first insulating sheet can directly contact the second side of the assembly of photovoltaic cells 10, and a center portion of the first insulating sheet can directly contact the first side of the assembly of photovoltaic cells 10. In one embodiment, the edge portion of the front-side insulating sheet 110 can directly contact the backside of the assembly of photovoltaic cells 10, and a center portion of the front-side insulating sheet 110 can directly contact the front side of the assembly of photovoltaic cells 10 as illustrated in FIG. 4. In one embodiment, the edge portion of the backside insulating sheet 120 can directly contact the front side of the assembly of photovoltaic cells 10, and a center portion of the backside insulating sheet 120 can directly contact the backside of the assembly of photovoltaic cells 10.

In the first configuration illustrated in FIG. 4, the front-side insulating sheet 110 has a front-side-sheet distal surface 111 and a front-side-sheet proximal surface 113. The front-side-sheet distal surface 111 is more distal from the assembly of photovoltaic cells 10 than the front-side-sheet proximal surfaces 113 is from the assembly of photovoltaic cells 10. The front-side-sheet distal surface 111 curves (i.e., curls or folds) around at the periphery of the assembly of photovoltaic cells 10 and continuously extends to the backside of the assembly of photovoltaic cells 10. The backside insulating sheet 120 has a backside-sheet distal surface 121 and a backside-sheet proximal surface 123. The backside-sheet distal surface 121 is more distal from the assembly of photovoltaic cells 10 than the backside-sheet proximal surfaces 123 is from the assembly of photovoltaic cells 10. The backside insulating sheet 120 does not curve (i.e., does not curl or fold) around the assembly of photovoltaic cells 10. A peripheral region of the front-side-sheet distal surface 111 located on the backside of the assembly of photovoltaic cells 10 is attached to a peripheral region of the backside-sheet proximal surface 123 through the adhesion material layer 130 or by direct bonding.

In the second configuration illustrated in FIG. 5, the front-side insulating sheet 110 has a front-side-sheet distal surface 111 and a front-side-sheet proximal surface 113. The front-side-sheet distal surface 111 is more distal from the assembly of photovoltaic cells 10 than the front-side-sheet proximal surfaces 113 is from the assembly of photovoltaic cells 10. The front-side insulating sheet 110 does not curve around the assembly of photovoltaic cells 10. The backside insulating sheet 120 has a backside-sheet distal surface 121 and a backside-sheet proximal surface 123. The backside-sheet distal surface 121 is more distal from the assembly of photovoltaic cells 10 than the backside-sheet proximal surfaces 123 is from the assembly of photovoltaic cells 10. The backside-sheet distal surface 121 curves around at the periphery of the assembly of photovoltaic cells 10 and continuously extends to the front side of the assembly of photovoltaic cells 10. A peripheral region of the backside-sheet distal surface 121 located on the front side of the assembly of photovoltaic cells 10 is attached to a peripheral region of the front-side-sheet proximal surface 113 through the adhesion material layer 130 or by direct bonding.

Referring to FIGS. 6 and 7, a third exemplary configuration and a fourth exemplary configuration of the photovoltaic panel 100 are illustrated in a respective vertical cross-sectional view. A first insulating sheet is disposed over one side of the plurality of photovoltaic cells 10, and a second insulating sheet is disposed over another side of the plurality of photovoltaic cells 10. In the third configuration illustrated in FIG. 6, the first insulating sheet is the front-side insulating sheet 110 and the second insulating sheet is the backside insulating sheet 120. In the fourth configuration illustrated in FIG. 7, the first insulating sheet is the backside insulating sheet 120 and the second insulating sheet is the front-side insulating sheet 110.

The curled (i.e., folded) edge portion of the first insulating sheet can be placed over, and pressed against, the edge portions of the second insulating sheet with an adhesion material layer 130 therebetween. The curled edge portion of the first insulating sheet can be attached to the edge portion of the second insulating sheet while the edge portion of the second insulating sheet is disposed between the curled edge portion of the first insulating sheet and the plurality of photovoltaic cells 10.

In the configurations illustrated in FIGS. 6 and 7, each edge portion of the first insulating sheet can be curled around an edge of the assembly of photovoltaic cells 10 to a side of the second insulating sheet. Each edge portion of the second insulating sheet is more proximal to the assembly of photovoltaic cells 10 than the curled edge portion of the first insulating sheet is to the assembly of photovoltaic cells 10 in the adhesion region AR. In one embodiment, the second insulating sheet can be in a flat configuration without a curled portion. In other words, the entirety of the second insulating sheet may be flat, and may be in contact with the top surface or the bottom surface of the assembly of photovoltaic cells 10 subject to the curvature of the surface of the assembly of the photovoltaic cells 10 generated by the flexible connections provided by the interconnect structures 20. The edge portion of the first insulating sheet is attached to a distal surface of the edge portion of the second insulating sheet. The edge portions of the second insulating sheet can contact the assembly of photovoltaic cells 10 while the curled edge portion of the first insulating sheet is attached to the edge portion of the second insulating sheet.

In one embodiment, the edge portion of the first insulating sheet does not directly contact the second side of the assembly of photovoltaic cells 10. In one embodiment, the front side surfaces of the assembly of photovoltaic cells 10 can be contacted only by the front-side insulating sheet 110, and the backside surfaces of the assembly of photovoltaic cells 10 can be contacted only by the backside insulating sheet 120.

In the third configuration illustrated in FIG. 6, the front-side insulating sheet 110 has a front-side-sheet distal surface 111 and a front-side-sheet proximal surface 113. The front-side-sheet distal surface 111 is more distal from the assembly of photovoltaic cells 10 than the front-side-sheet proximal surfaces 113 is from the assembly of photovoltaic cells 10. The front-side-sheet distal surface 111 curves around at the periphery of the assembly of photovoltaic cells 10 and continuously extends to the backside of the assembly of photovoltaic cells 10. The backside insulating sheet 120 has a backside-sheet distal surface 121 and a backside-sheet proximal surface 123. The backside-sheet distal surface 121 is more distal from the assembly of photovoltaic cells 10 than the backside-sheet proximal surfaces 123 is from the assembly of photovoltaic cells 10. The backside insulating sheet 120 does not curve around the assembly of photovoltaic cells 10. A peripheral region of the front-side-sheet proximal surface 113 located on the backside of the assembly of photovoltaic cells 10 is attached to a peripheral region of the backside-sheet distal surface 121 through the adhesion material layer 130 or by direct bonding.

In the fourth configuration illustrated in FIG. 7, the front-side insulating sheet 110 has a front-side-sheet distal surface 111 and a front-side-sheet proximal surface 113. The front-side-sheet distal surface 111 is more distal from the assembly of photovoltaic cells 10 than the front-side-sheet proximal surfaces 113 is from the assembly of photovoltaic cells 10. The front-side insulating sheet 110 does not curve around the assembly of photovoltaic cells 10. The backside insulating sheet 120 has a backside-sheet distal surface 121 and a backside-sheet proximal surface 123. The backside-sheet distal surface 121 is more distal from the assembly of photovoltaic cells 10 than the backside-sheet proximal surfaces 123 is from the assembly of photovoltaic cells 10. The backside-sheet distal surface 121 curves around at the periphery of the assembly of photovoltaic cells 10 and continuously extends to the front side of the assembly of photovoltaic cells 10. A peripheral region of the backside-sheet proximal surface 123 located on the front side of the assembly of photovoltaic cells 10 is attached to a peripheral region of the front-side-sheet distal surface 111 through the adhesion material layer 130 or by direct bonding.

Referring to FIGS. 8 and 9, a fifth exemplary configuration and a sixth exemplary configuration of the photovoltaic panel 100 are illustrated in a respective vertical cross-sectional view. The area of the first insulating sheet can be greater than the total area of the assembly of photovoltaic cells 10. The area of the second insulating sheet can be greater than the total area of the assembly of photovoltaic cells 10, and can be less than the total area of the first insulating sheet.

The edge portions of the second insulating sheet can be curled (i.e., folded) around at a respective proximal edge (i.e., an edge that is proximal to a respective edge portion) of the assembly of photovoltaic cells 10 without crossing over to the first side, i.e., while remaining on the second side. Thus, the edge portions of the second insulating sheet extending outside the periphery of the assembly of photovoltaic cells 10 can be curled around such that the curled edge portions of the second insulating sheet overlies an underlying portion of the second insulating sheet.

The curled (i.e., folded) edge portion of the first insulating sheet can be placed over, and pressed against, the folded edge portions of the second insulating sheet, optionally with an adhesion material layer 130 therebetween. The curled edge portion of the first insulating sheet can be attached to the folded edge portion of the second insulating sheet while the folded edge portion of the second insulating sheet is disposed between the curled edge portion of the first insulating sheet and a flat portion of the second insulating sheet that contacts the second side of the assembly of photovoltaic cells 10. The curled edge portions of the first insulating sheet may be bonded to the folded edge portions of the second insulating sheet through the adhesion material layer 130, or may be directly bonded to the edge portion of the second insulating sheet by applying heat to the overlap region and inducing polymer bonding between the first insulating sheet and the second insulating sheet.

In the configurations illustrated in FIGS. 8 and 9, the edge portions of the first and second insulating sheets are curled (i.e., folded) to provide a curled (i.e., folded) region. The changed in the orientation of the curled region of the second insulating sheet can be 180 degrees such that each curled region includes a respective folded region. Each edge portion of the first insulating sheet can be curled around an edge of the assembly of photovoltaic cells 10 to a side of the second insulating sheet. Each folded edge portion of the second insulating sheet is more proximal to the assembly of photovoltaic cells 10 than the curled edge portion of the first insulating sheet is to the assembly of photovoltaic cells 10 in the adhesion region AR. The edge portions of the second insulating sheet include curled portions of the second insulating sheet that are more distal from the plurality of photovoltaic cells 10 than a center portion of the second insulating sheet is from the plurality of photovoltaic cells 10 at least by the thickness of the second insulating sheet. The curled edge portion of the first insulating sheet is attached to a folded portion of the proximal surface of the second insulating sheet.

In one embodiment, the edge portion of the first insulating sheet does not directly contact the second side of the assembly of photovoltaic cells 10. In one embodiment, the front side surfaces of the assembly of photovoltaic cells 10 can be contacted only by the front-side insulating sheet 110, and the backside surfaces of the assembly of photovoltaic cells 10 can be contacted only by the backside insulating sheet 120.

In the fifth configuration illustrated in FIG. 8, the front-side insulating sheet 110 has a front-side-sheet distal surface 111 and a front-side-sheet proximal surface 113. Flat portions of the front-side-sheet distal surface 111 (located on the front side of the assembly of photovoltaic cells 10) are more distal from the assembly of photovoltaic cells 10 than flat portions of the front-side-sheet proximal surfaces 113 (located on the front side of the assembly of photovoltaic cells 10) are from the assembly of photovoltaic cells 10. The front-side-sheet distal surface 111 curves around at the periphery of the assembly of photovoltaic cells 10 and continuously extends to the backside of the assembly of photovoltaic cells 10. Folded (curled) portions of the front-side-sheet distal surface 111 located on the backside of the assembly of photovoltaic cells 10 are more distal from the assembly of photovoltaic cells 10 than folded (curled) portions of the front-side-sheet proximal surfaces 113 located on the backside of the assembly of photovoltaic cells 10 are from the assembly of photovoltaic cells 10.

The backside insulating sheet 120 has a backside-sheet distal surface 121 and a backside-sheet proximal surface 123. Flat portions of the backside-sheet distal surface 121 located on the front side of the assembly of photovoltaic cells 10 are more distal from the assembly of photovoltaic cells 10 than flat portions of the backside-sheet proximal surfaces 123 located on the front side of the assembly of photovoltaic cells 10 are from the assembly of photovoltaic cells 10. Folded portions of the backside-sheet distal surface 121 located on the backside of the assembly of photovoltaic cells 10 are more proximal to the assembly of photovoltaic cells 10 than folded portions of the backside-sheet proximal surfaces 123 located on the backside of the assembly of photovoltaic cells 10 are to the assembly of photovoltaic cells 10. The backside insulating sheet 120 is located entirely on the backside of the assembly of photovoltaic cells 10. A peripheral region of the front-side-sheet proximal surface 113 located on the backside of the assembly of photovoltaic cells 10 is attached to a folded portion of the backside-sheet proximal surface 123 through the adhesion material layer 130 or by direct bonding.

In the sixth configuration illustrated in FIG. 9, the front-side insulating sheet 110 has a front-side-sheet distal surface 111 and a front-side-sheet proximal surface 113. Flat portions of the front-side-sheet distal surface 111 (located on the front side of the assembly of photovoltaic cells 10) are more distal from the assembly of photovoltaic cells 10 than flat portions of the front-side-sheet proximal surfaces 113 (located on the front side of the assembly of photovoltaic cells 10) are from the assembly of photovoltaic cells 10. Folded portions of the front-side-sheet distal surface 111 (located on the front side of the assembly of photovoltaic cells 10) are more proximal to the assembly of photovoltaic cells 10 than folded portions of the front-side-sheet proximal surfaces 113 (located on the front side of the assembly of photovoltaic cells 10) are to the assembly of photovoltaic cells 10.

Flat portions of the backside-sheet distal surface 121 (located on the backside of the assembly of photovoltaic cells 10) are more distal from the assembly of photovoltaic cells 10 than flat portions of the backside-sheet proximal surfaces 123 (located on the backside of the assembly of photovoltaic cells 10) are from the assembly of photovoltaic cells 10. The backside-sheet distal surface 121 curves around at the periphery of the assembly of photovoltaic cells 10 and continuously extends to the front side of the assembly of photovoltaic cells 10. Folded (curled) portions of the backside-sheet distal surface 121 located on the front side of the assembly of photovoltaic cells 10 are more distal from the assembly of photovoltaic cells 10 than folded (curled) portions of the backside-sheet proximal surfaces 123 located on the front side of the assembly of photovoltaic cells 10 are from the assembly of photovoltaic cells 10. The front-side insulating sheet 110 is located entirely on the front side of the assembly of photovoltaic cells 10. A peripheral region of the backside-sheet proximal surface 123 located on the front side of the assembly of photovoltaic cells 10 is attached to a folded portion of the front-side-sheet proximal surface 113 through the adhesion material layer 130 or by direct bonding.

Referring to all drawings and according to various embodiments of the present disclosure, a photovoltaic panel 100 comprises a plurality of photovoltaic cells 10 electrically connected by interconnect structures 20, a front-side insulating sheet 110 extending over the plurality of photovoltaic cells, and a backside insulating sheet 120 extending under the plurality of photovoltaic cells. An edge portion of the front-side insulating sheet 110 is adjoined to an edge portion of the backside insulating sheet 120 in an adhesion region AR. At least one of the front-side insulating sheet 110 or the backside insulating sheet 120 is folded over peripheral photovoltaic cells of the plurality of photovoltaic cells 10.

In one embodiment, the adhesion region AR has an areal overlap with the peripheral photovoltaic cells of the plurality of photovoltaic cells 10 in a view along a direction perpendicular to front-side surfaces of the peripheral photovoltaic cells 10.

In one embodiment, the areal overlap extends around an entire periphery of the plurality of photovoltaic cells 10. In one embodiment, the plurality of photovoltaic cells 10 are arranged as a one-dimensional or a two-dimensional array; and the areal overlap extends over each peripheral photovoltaic cell 10 of the plurality of photovoltaic cells 10. A peripheral photovoltaic cell 10 refers to any photovoltaic cell that borders an edge of a plurality of photovoltaic cells 10, such an edge of an assembly of photovoltaic cells 10. In one embodiment, the areal overlap has a shape of a rectangular frame with a rectangular inner periphery and a rectangular outer periphery. The lateral spacing between the rectangular inner periphery and the rectangular outer periphery may be uniform. In one embodiment, the plurality of photovoltaic cells 10 have a generally rectangular outer periphery that is located between the rectangular inner periphery of the rectangular frame and the rectangular outer periphery of the rectangular frame in the view along the direction perpendicular to the front-side surfaces of the peripheral portions of the plurality of photovoltaic cells 10, as illustrated in FIG. 3B.

In one embodiment, the edge portion of the front-side insulating sheet 110 is adjoined to the edge portion of the backside insulating sheet 120 in the adhesion region AR by an adhesion material layer 130 or by polymer-to-polymer bonding between materials of the front-side insulating sheet and the backside insulating sheet.

In the first embodiment illustrated in FIG. 4, the edge portion of front-side insulating sheet 110 is folded over the peripheral photovoltaic cells 10 between a back side of the peripheral photovoltaic cells 10 and the backside insulating sheet 120. In the second embodiment illustrated in FIG. 5, the edge portion of the backside insulating sheet 120 is folded over the peripheral photovoltaic cells 10 between a front side of the peripheral photovoltaic cells 10 and the front-side insulating sheet 110.

In the third embodiment illustrated in FIG. 6, the edge portion of the front-side insulating sheet 110 is folded over a back side of the peripheral photovoltaic cells 10 and over the backside insulating sheet 120. In the fourth embodiment illustrated in FIG. 7, the edge portion of the backside insulating sheet 120 is folded over a front side of the peripheral photovoltaic cells 10 and over the front-side insulating sheet 110.

In the fifth embodiment illustrated in FIG. 8, the edge portions of both the front-side insulating sheet 110 and the backside insulating sheet 120 are folded over a back side of the peripheral photovoltaic cells 10. In the sixth embodiment illustrated in FIG. 9, the edge portions of both the front-side insulating sheet 110 and the backside insulating sheet 120 are folded over a front side of the peripheral photovoltaic cells 10.

Although the foregoing refers to particular preferred embodiments, it will be understood that the present invention is not so limited. It will occur to those of ordinary skill in the art that various modifications may be made to the disclosed embodiments and that such modifications are intended to be within the scope of the present invention. It is to be understood that the present invention is not limited to the embodiment(s) and the example(s) described above and illustrated herein, but encompasses any and all variations falling within the scope of the appended claims. For example, as is apparent from the claims and specification, not all method steps need be performed in the exact order illustrated or claimed, but rather in any order that allows the proper formation of the solar cells of the present invention.

What is claimed is:

1. A photovoltaic panel, comprising:
   a plurality of photovoltaic cells electrically connected by interconnect structures;
   a front-side insulating sheet extending over the plurality of photovoltaic cells; and
   a backside insulating sheet extending under the plurality of photovoltaic cells,
   wherein:
   an edge portion of the front-side insulating sheet is adjoined to an edge portion of the backside insulating sheet in an adhesion region, and
   at least one of the front-side insulating sheet or the backside insulating sheet is folded over peripheral photovoltaic cells of the plurality of photovoltaic cells;
   wherein the edge portion of the front-side insulating sheet is folded over a back side of the peripheral photovoltaic cells and over the backside insulating sheet.

2. A photovoltaic panel, comprising:
a plurality of photovoltaic cells electrically connected by interconnect structures;
a front-side insulating sheet extending over the plurality of photovoltaic cells; and
a backside insulating sheet extending under the plurality of photovoltaic cells,
wherein:
an edge portion of the front-side insulating sheet is adjoined to an edge portion of the backside insulating sheet in an adhesion region, and
at least one of the front-side insulating sheet or the backside insulating sheet is folded over peripheral photovoltaic cells of the plurality of photovoltaic cells;
wherein the edge portion of the backside insulating sheet is folded over a front side of the peripheral photovoltaic cells and over the front-side insulating sheet.

* * * * *